United States Patent [19]

Sullivan

[11] 4,056,773
[45] Nov. 1, 1977

[54] PRINTED CIRCUIT BOARD OPEN CIRCUIT TESTER

[76] Inventor: Donald F. Sullivan, 115 Cambridge Road, King of Prussia, Pa. 19406

[21] Appl. No.: 717,512

[22] Filed: Aug. 25, 1976

[51] Int. Cl.² .............................................. G01R 31/02
[52] U.S. Cl. .................................. 324/73 PC; 324/51
[58] Field of Search ................. 324/51, 52, 73 PC, 66

[56] References Cited

U.S. PATENT DOCUMENTS

| 2,399,753 | 5/1946 | McLarn | 324/73 PC UX |
| 3,714,572 | 1/1973 | Ham et al. | 324/73 PC X |
| 3,723,867 | 3/1973 | Canarutto | 324/73 PC |
| 3,830,956 | 8/1974 | Wootton et al. | 324/73 PC X |
| 3,942,778 | 3/1976 | Fadiga et al. | 324/73 PC X |

FOREIGN PATENT DOCUMENTS

| 1,297,377 | 11/1972 | United Kingdom | 324/73 PC |

OTHER PUBLICATIONS

De Groat et al., *Finding Shorts in Printed Circuit Boards,* IBM Tech. Discl. Bull. vol. 12, No. 5, Oct. 1969, pp. 655, 656.
Senger et al., *Membrane Contact Array with Photosensitive Interconnections,* IBM Tech. Dis. Bull. vol. 14, No. 11, Apr. 1972, p. 3427.
Dodd et al., *Printed-Circuit Tester* IBM Tech. Dis. Bull. vol. 16, No. 9, Feb. 1974, pp. 2848, 2849.

*Primary Examiner*—Gerard R. Strecker
*Attorney, Agent, or Firm*—Laurence R. Brown

[57] ABSTRACT

Open circuits are detected in printed circuit board conductors before components are mounted by means of contacting both sides of the board with flexible conductive test patterns connected to test circuits by decreasing below atmospheric the pressure about said board.

The testing is done by scanning manually isolated circuit positions on one test pattern with an LED panel to signify any broken continuity in the printed circuit board conductors. All circuit leads are tested in parallel. Short circuit tests between the conductors are also tested by the same test array by registering the test circuit pattern with one of opposite conductivity characteristics to cause a continuity when circuit pattern conductor exceeds predetermined limits or bridges the path to another conductor.

17 Claims, 5 Drawing Figures

U.S. Patent  Nov. 1, 1977  Sheet 1 of 2  4,056,773
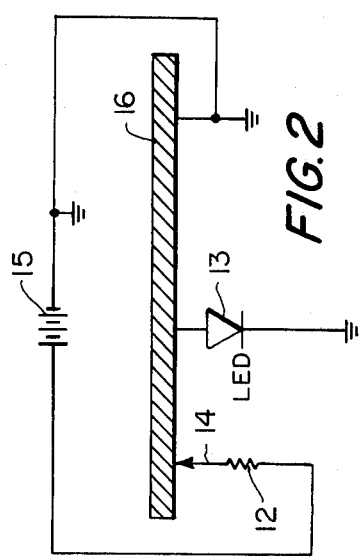
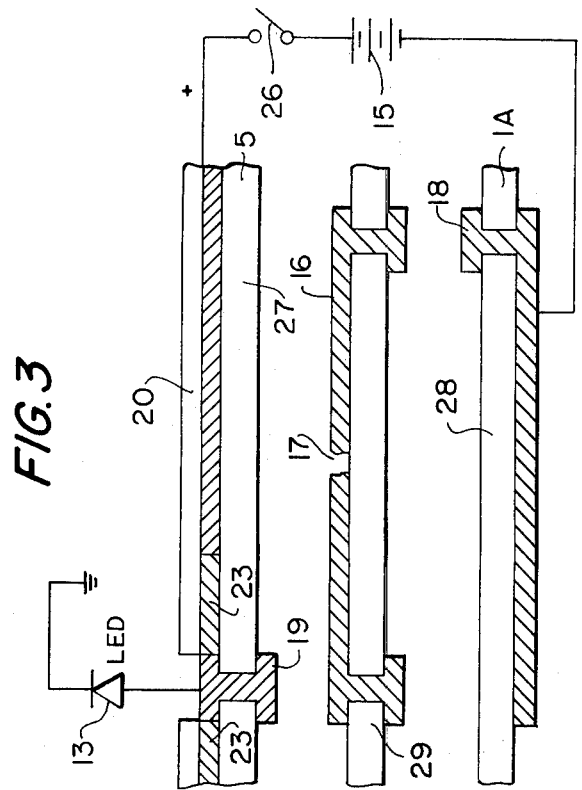
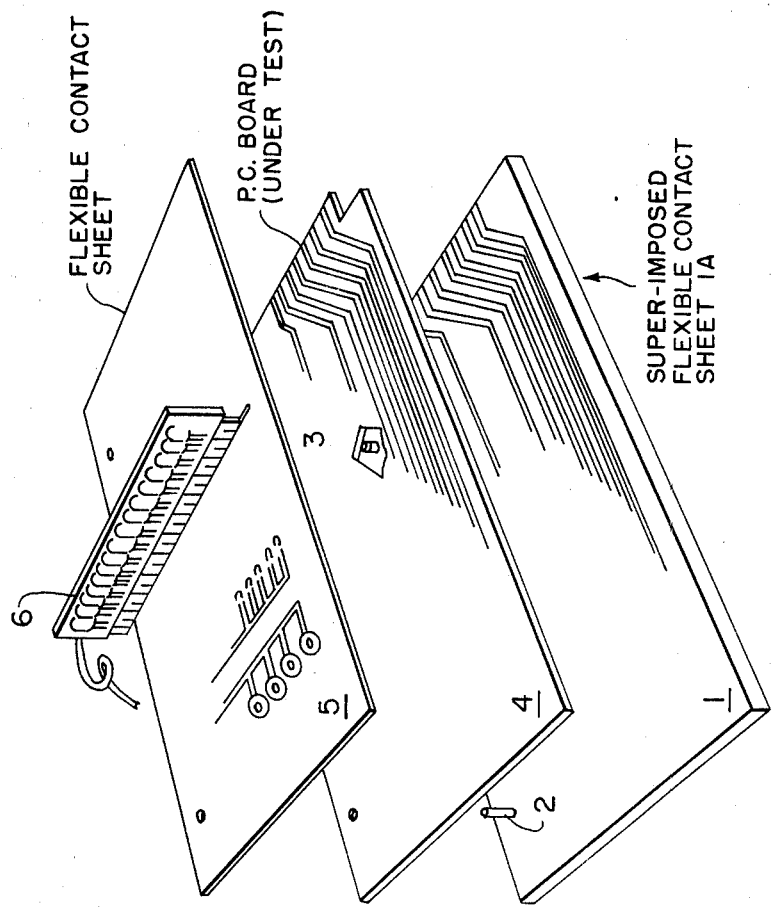

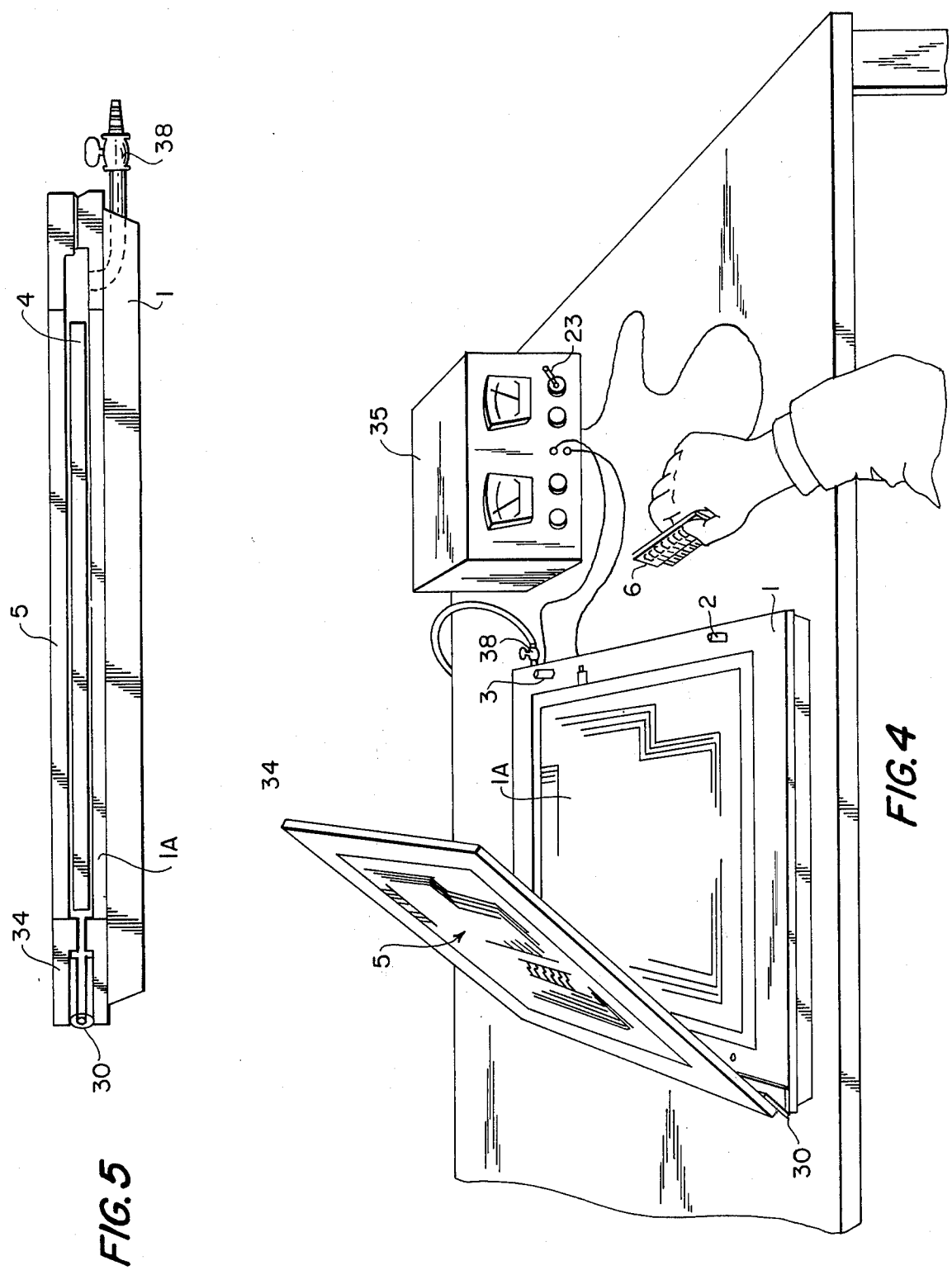

PRINTED CIRCUIT BOARD OPEN CIRCUIT TESTER

This disclosure relates to test equipment for use with printed circuits; both rigid boards and flexible circuits; more specifically, test equipment for detecting short-circuited and open-circuited conductors on printed circuits prior to addition of electrical components.

PRIOR ART AND OBJECTS

During the manufacture of printed circuits having conductor widths of 0.010 inch and under, open-circuited conductors become a major source of rejects. Normally associated with conductor widths of 0.010 inch are conductor spacing of 0.010 also. This close spacing frequently results in short circuits between adjacent conductors, generally the results of under-etching or plating resist breakdown.

Open and shorted conductors if not detected prior to the addition of electrical components, usually results in wastage of testing time. Generally, it takes 10 times as long to detect a faulty conductor after addition of components.

The present art of open and short circuit detection usually consists of either visual inspections, or the use of expensive automatic continuity testers.

Visual inspections are time consuming, and much less than 100% effective. For example, a short circuit can result from a breakdown in plating resist, which to the visual inspector, appears to be proper. Similarly, a fine line of the order of 0.010-inch wide can be completely etched away in places with no outward indication to the inspector.

One objective then, is to provide a more certain method for detecting open and shorts than can be obtained by visual inspections.

Automatic continuity testers are used by very large volume printed circuit manufacturers or users, and are generally priced beyond the reach of the smaller manufacturer. The automatic continuity testers almost without exception rely on the bed-of-nails for making the necessary hundred or thousands of contacts with the test printed circuit.

The bed-of-nails is a feasible way to contact a board loaded with components and soldered, for the board surface is extremely rough, both from component leads projecting through the board, and rough from the solder beads.

Naturally, the bed-of-nails are on fixed centers and do not necessarily match with the test printed circuit pads.

Another object of the invention is to provide a customized contact set for each printed circuit board type, and obviate the need for the bed-of-nails contactors.

Automatic continuity testers have three common problems. First, the equipment is expensive; second, the bed-of-nails used to effect contact with the test PC board requires tremendous pressure; and thirdly, the programming required to interpret the electrical signals picked up by the bed-of-nails is very time consuming and costly.

A further objective of this disclosure then is to provide an electrical tester which does not require expensive and ponderous equipment and which does not require extensive programming.

Another objective of the invention is to provide an integrated tester which can be used to test printed circuits on a production basis with a minimum of handling and manual effort.

A further objective of the invention is to provide the means for testing a large number of conductors, not sequentially, but in parallel. The tester described tests all conductive surfaces on each side instantaneously for shorts, since all conductors are tested in parallel. Open circuits are also tested in parallel though indication is established by manual scanning of approximately 256 data points in parallel.

My copending application Ser. No. 596,303 filed July 16, 1975 now U.S. Pat. No. 4,012,693 accomplishes some of these objects, but only detects short circuits on one side before eyelets are on the board.

BRIEF DESCRIPTION OF THE INVENTION

In essence, the tester consists of two flexible contact sheets, with the Test Printed Circuit (hereafter abbreviated TPC) sandwiched between and pressed tightly together by vacuum action. Each flexible contact sheet has unique conductive patterns designed specifically for one TPC type. Each flexible contact sheet checks the TPC with plated through holes for short circuits on the side it touches, while one flexible contact sheet has the additional capabilities of testing the entire board for open-circuited conductors.

One flexible contact sheet is mounted on a rigid base, with registration pins projecting upward to receive TPC. The other flexible contact sheet is mounted on a rigid frame and can be raised and lowered (in a clam shell fashion) with a precision hinge maintaining registration.

In operation, the test person places TPC on registration pins, lowers the top flexible contact sheet to contact TPC, applies vacuum and begins the test sequence. Via selector switch, TPC side A is tested for shorts, then side B is tested for shorts (both instantaneously, for all conductors on each side are tested in parallel). To test for opens, the exposed surface of the flexible contact sheet is manually scanned with light emitting diodes mounted on a strip. As the strip is moved across the flexible sheet, a light-emitting diode lights in response to detecting an open conductor.

THE DRAWING

In the drawing:

FIG. 1 is a perspective sketch showing the relationship of the TPC and the test circuit jigs afforded by this invention, FIG. 2 is a schematic circuit diagram illustrating the test procedure, FIG. 3 is a sketch of a broken away portion of the test jigs and TPC showing electric circuit test paths therein, FIG. 4 is an open perspective view of the testing jig and associated equipment, and FIG. 5 is an end closed view of the testing jig.

DETAILED DESCRIPTION OF THE INVENTION

Reference is made to FIG. 1. Mounting base 1, to which registration pins 2 and 3 are mounted, is solid and adapted for superimposing a flexible contact sheet 1A. This sheet contains a circuit having conductor patterns required to test the lower side of TPC 4 for shorts. TPC 4 is also held in register by guide holes registering with pins 2 and 3. Flexible sheet 5 on FIG. 1 has circuits to test TPC upper side for short circuits, and both upper and lower sides for open conductors. LED strip 6 scans the top surface of flexible sheet 5, to detect open conductors.

SHORT CIRCUIT DETECTION

Short circuits are detected in the manner described in my said copending application by preparing a reverse pattern of TPC and etching away the copper corresponding to the conductors of TPC, plus a few thousandths of an inch for clearance. If the resulting flexible contact sheet is placed over the TPC lower side in exact register, then there will be no metal-to-metal contact between the two. However, if TPC lower side has a short circuit between adjacent conductors resulting from unetched copper, or solder slivers, then metal-to-metal contact will be established, and if a voltage difference is applied between TPC conductors and the flexible contact sheet metal pattern, then the short circuit can be detected by the resulting current flow. Thus, a large number of conductors, numbering in the thousands, can be simultaneously tested in parallel for short circuits.

OPEN CIRCUIT DETECTION

The flexible contact sheet 1A, which is essentially a voltage distributor, is designed so that, for each TPC conductor, one end is grounded and the other end is connected to a higher potential 15, through a series current-limiting resistor 12 shown in FIG. 2 in equivalent circuit form for open circuit detection. For a continuous conductor 16 with low ohmic resistance both ends are essentially at ground potential and a light emitting diode LED 13 does not glow as it is effectively shorted out by the low-resistance conductor 16. An open in the conductor at some point to the right of LED 13 causes the potential at point 14 to rise toward the source potential, and light emitting diode 13 conducts and glows. Resistor 12 serves to limit the current drawn by continuous conductor 16, and in the event of an open conductor, resistor 12 limits the current drawn by the LED.

This technique is implemented in the construction of the flexible contact sheets. In an earlier paragraph it was described how, for short circuit testing, the flexible contact sheet was etched so that copper was removed from areas corresponding to TPC conductor pattern. Selectively, as designed, copper pads are left on the flexible sheet as diagrammed on the top side of contact sheet 5 in FIG. 1 and these pads are connected to the opposite side of the flexible sheet via through hole plating. For each TPC conductor one of these pads will be connected to ground potential, while another pad corresponding to the other end of the conductor will be connected to a positive potential through a resistor.

Reference is made to FIG. 3, TPC 4 has conductor 16 with open circuit at location 17. Flexible sheets 1A and 5 have plated through pads 18 and 19 connected to ground and a positive bus respectively. Pad 19 is connected to the positive bus by means of a semi conductive resistive material 23 applied by screen printing. Resistive material 23, preferably a carbon-impregnated lacquer of known composition will be selected to provide sufficient current to permit LED 13 to glow brightly yet having sufficient resistance so that approximately 1000 printed resistors in parallel will not exceed the current capacity of voltage source 15. A 5000 ohm resistor can be printed using a conductive lacquer having a resistivity of 100 ohms per square inch. Insulation layer 20 prevents abrasion of the printed resistors, and also restricts the areas that LED 13 can contact to only the proper pads.

Alternately, and depending on the type and quantity of PCs to be tested, instead of individual printed resistors a conductive elastomer blanket may be used. This conductive blanket is placed between the mounting base and flexible contact sheet 1A. When the vacuum is applied those portions of the blanket that are not insulated are forced into electrical contact with the proper circuit pads of TPC via holes in the flexible sheet. On the bottomside of the blanket (and against the mounting base) a sheet of foil is laminated and a positive voltage is applied. The elastomeric blanket has the following characteristics:

Thickness: 0.005 inches
Resistivity: 8000 ohm-centimeter
Durometer: 55
Resistance Value: 5000 ohms per TPC conductor

OPEN CIRCUIT INDICATION

As illustrated in FIG. 3, broken conductor 16 causes pad 19 (and the TPC contacting pad) to rise toward the potential of voltage source 15. On conductor-dense boards there may be as many as 2000 conductors, and the object is to be able to detect with great reliability one discontinuous conductor anywhere on TPC. Thus, as LED 13 in FIG. 3 scans across many grounded pads, it must detect and report the single pad with a positive voltage. Reliable detection is achieved by placing a number of LEDs side by side, each with its own contactor, so that every pad is sampled without electrical interference from the adjacent conductors. Such is shown at 6 in FIG. 1. Alternatively, open detection without light generation can be obtained through use of semi conductors without light capabilities in which case the current sensor actuates an audio-visual alarm.

LEDs are mounted at the top of a PC strip in clear view of the operator. Contacts ride on the top surface of the flexible sheet 5 and transmit voltage to LEDs via conductors on the PC strip. Typically, contactors may be spaced on 0.062 inch centers to assure that every pad on TPC is contacted by at least one LED contactor.

Throughout this disclosure, a negative ground is used, and "positive bus." The tester can be operated with a positive ground (with reversed polarity of LEDs). The voltage source can be alternating current if desired.

Having illustrated how the flexible contact sheets are used to detect short circuits and open circuits independently, it will now be described how two flexible contact sheets can be used to test both sides of a TPC having plated through holes 29. Reference is made to FIG. 3. In addition to the conductors associated with open circuit detection, surfaces 27, 28 on the two flexible contact sheets also contain the short-seeking conductive areas 19 which nest around, but do not thermally contact conductor 16 and associated pads. These short-seeking areas are connected to a voltage potential by selector switch 26.

THE COMPLETE TESTER

The tester is designed to be used in production testing; both by PC manufacturers and by PC users prior to addition of electrical components. FIGS. 4 and 5 show a complete tester assembly.

Base 1 provides secure mounting for registration pins 2, 3 etc. and hinges 30 for holding upper movable frame 34 with flexible contact sheet 5. Vacuum line 38 provides strong pressure against TPC 4 by flexible sheets 1A and 5. Unit 35 provides electrical voltage for the tester; current-sensing; audio-visual alarms; and switching.

An operator uses the tester in the following way; a TPC 4 with plated through holes is placed on the base with registration pins mating with registration holes in the test PC; and frame 34 is lowered. Vacuum line 38 is activated and TPC is held secure between flexible sheets 1A and 5. A selector switch 26 on unit 35 applies voltage to the short-seeking metallic conductors on flexible sheet 5 and then to flexible sheet 1A. Any short causes unit 35 to alarm by the testing method shown in my referenced copending application. The voltage used for short-circuit testing can be up to or beyond 1500 volts for leakage testing.

Next, the selector switch 26 of unit 35 is changed, and voltage is applied to the positive bus of flexible sheet 5. LED strip 6 is drawn across the exposed upper surface of flexible sheet 5 in search of open conductors. A detected open circuit is signalled by the appropriate LED and/or the current-sensing circuit of unit 35.

APPLICABILITY

The tester as described can be used to test both flexible and rigid printed circuits, having circuitry on one or both sides, and both with and without plated through holes. The principle difference being that in order to test a two sided printed circuit without plated through holes it is necessary for resistance elements to be contained on each of the mating flexible contact sheets.

In addition to testing printed circuits for open conductors, the disclosed invention can be used, with proper fixturing, to test cable harnesses and backplanes for continuity. The fixturing adapts the connector pins, which may be recessed, to an accessible, near-planar surface.

CONSTRUCTION METHODS

The flexible contact sheets are manufactured in accordance with techniques used in the manufacture of flexible printed circuits. Prior to manufacture, certain pieces of artwork (photographic film) are prepared, principally from the artwork used to manufacture TPC. Referring to FIG. 4 and flexible contact sheets 1A and 5, the following artwork is generated for a TPC having plated through holes:
Contact Sheet 1A
CONDUCTIVE PATTERN TO CONTACT TPC
DRILLED-HOLE PATTERN
Contact Sheet 5
CONDUCTIVE PATTERN TO CONTACT TPC
DRILLED-HOLE PATTERN
CONDUCTIVE PATTERN ON SIDE AWAY FROM TPC
RESISTIVE INK PRINTING PATTERN
INSULATION COATING PATTERN
These will be described below.

From the artwork used in the manufacture of TPC, or preferably, from the oversize artwork masters, the TPC conductors are traced out as they make their way from board side to side and for each conductor, two circuit pads are selected, one at each end. One circuit pad is designed to be connected to ground on the flexible sheet, and one pad is designated to be connected to a resistance element.

The conductive pattern of contact sheet 1A (the side in contact with TPC) will be reversal of TPC conductor patterns, with two differences. First, the contact sheet conductive areas will be reduced slightly so that contact sheet conductors will be slightly narrower than the insulation areas of TPC. Second, for each TPC conductor, a pad is added to the contact sheet artwork, smaller in diameter than TPC circuit pads to insure insulation integrity between pad and reversed conductive areas. This pad is connected to the ground plane on the opposite side of flexible sheet 1A via a plated through hole. Each of these pads is added to the respective TPC film negative, which is then used in printing the etch resist.

The drill pattern is derived from TPC drill pattern by selecting holes which permit TPC pads to contact the ground plane or the positive plane, as designed. Alternatively, the TPC drill pattern can be used without change, in which case some holes will not have an accompanying pad and no contact will be made with TPC conductors at those locations.

The resistive ink pattern is derived from the TPC artwork negative defining TPC conductive patterns, by opaquing all lines and selected circuit pads, leaving only as clear areas those pads which are to have printed resistors connected. These clear areas may be expanded slightly photographically and used to make a printing screen stencil, which is then used to print the carbon-impregnated lacquer.

The fabrication of the flexible contact sheets is accomplished using the listed artwork to control plating resist application, plating and etching away unwanted metal.

The completed flexible contact sheet may be selectively immersion gold plated to assure good electrical contact with the TPC even after lengthy use in corrosive environments.

Flexible contact sheets may be fabricated from a dimensionally stable film of polyester or polyimide, clad with copper or aluminum 0.0014 or 0.0028 inches thick, as necessary for flexible contact sheet conductors to firmly contact TPC base laminate.

In FIG. 4, the vacuum connection 38 serves together with reasonably close fit of the frame members 1 and 34 to adhere the outer flexible circuits closely to the two surfaces of TPC for establishing firm electrical contact. The two flexible conductor carrying members 1A and 5 therefore are preferably suspended as shown in frame 34 in an aperture to form a substantially air tight seal with the outer surface of the flexible conductor sheets 1A and 5 exposed to atmospheric pressure. Then vacuum means 38 withdraws around centrally interspersed TPC 4 the atmospheric air and causes forced contact of the adjacent flexible partly conductive surfaces therewith. This is superimposed upon reasonable mechanical force caused by a thickness of the TPC slightly greater than the distance between the two inner surfaces of the flexible sheets 5 and 1A (not shown in FIG. 5 for purposes of better identification of the separate members).

The manually contacted alarm assembly 6 which is shown in FIGS. 1 and 4 has enough side by side LEDs in parallel, each having a separate extending contact finger which can be brushed across flexible sheet 5 for contact with the array pads 19 (FIG. 3) contacting the end pad (29) of conductors 16, for example. These may be located at different scanning positions along the length of flexible sheet 5 so that the array may be scanned simply and uncritically. Any lamp terminal electrode contacting a broken conductor 16 pad (29) will light through its resistor 23. Thus, the contact fingers are close enough together that no pads will be missed, and with lateral misregistration if two LEDs are lighted, no harm is done. Thus, a non-critical scanning procedure is afforded.

Having therefore described the invention and its construction features, it may be reproduced by those skilled in the art in various forms conforming to the spirit and scope of the invention as defined in the appended claims.

What is claimed is:

1. The method of testing printed circuit assemblies before mounting of components comprising the steps of,
   1. providing two access terminals for at least one conductor on the assembly to be tested at two spaced positions appearing on the assembly, preferably the extremity positions of all conductors,
   2. registering by means of a printed circuit overlay respective electrical test circuit contactors on at least one side of said assembly with respective ones of said access terminals, and
   3. testing the continuity of the conductor through the two test circuit contactors with a movable probe incorporating a conductive circuit completing a continuity testing circuit path between the two said contactors on said overlay.

2. The method defined in claim 1 including the additional steps of flexibly mounting the test circuit contactors on said overlay to flex said contactors and effect good electrical contact between them and said terminals, and positioning a lamp in said probe with circuitry to light it when a break of continuity between said two access terminals is present.

3. The method defined in claim 1 wherein the printed circuit assemblies have a plurality of conductors with said two access terminals and wherein the step of testing continuity comprises the step of manually scanning the assembly with an array of a plurality of continuity testing members connected to be visually changeable between conductivity and nonconductivity conditions appearing between the two access terminals, wherein different ones of said plurality of testing members is registrable with different ones of said access terminals as the array is scanned.

4. The method defined in claim 1 including the additional step of detecting short circuits between adjacent conductors by the substeps of mounting said contactors on said overlay along with a pattern of conductors of opposite conductivity of the conductors on the assembly, registering the overlay so that no electrical continuity appears between the conductors on said assembly and the conductors on said overlay in the absence of defective circuit conductors on said assembly encroaching into spaces between conductors, and sensing electrical continuity between the conductors on said overlay and the conductors on said assembly to detect potential short circuits.

5. Testing means for a printed circuit assembly having interposed conductor circuit leads and insulator regions on at least one surface without components mounted thereon comprising in combination, means defining on said assembly a pair of access terminals on opposite ends of said conductive circuit leads, test circuit contact means including at least one adjacent flexible contact sheet having test circuit contactors positioned for registering in electrical contact with said access terminals, continuity indication means connected to said test circuit contactors to sense circuit continuity between the two said access terminals, and manually movable probe means positionable to contact electrically both access terminals of each individual conductor lead on said assembly by way of electrical contact with said test circuit contactors for each said conductor lead, thereby to indicate open circuits when continuity is broken between said access terminals.

6. Means as defined in claim 5 wherein said failure indication means comprises an electric power source with one of its electrical poles contacting one end of a conductor under test on said assembly, and its other electrical pole contacting the other end of said conductor, current limiting means connected between said poles and said failure indication means constituting an alarm circuit bridged by said conductor to prevent an alarm until a lack of continuity of said conductor is present.

7. Means as defined in claim 6 wherein said alarm means comprises a light emitting diode connected between one said pole and the other by said conductor under test.

8. Means as defined in claim 6 wherein said current limiting means is a resistor mounted on said flexible contact sheet.

9. Means as defined in claim 8 wherein said flexible contact sheet has a multiplicity of circuit leads having one of said pair of access terminals for each lead disposed upon an outer surface when the flexible sheet is in contact with said assembly.

10. Means as defined in claim 9 wherein said resistors are printed on said flexible sheet for each conductor.

11. Means as defined in claim 9 with said failure indication means constituting a parallel array of lamps each having a separate electrode arranged to contact one of said terminals on said flexible sheet and spaced so that every access terminal is in contact with at least one of said electrodes when said array of lamps is manually scanned to contact the access terminals.

12. Means as defined in claim 5 wherein said flexible contact sheet is disposed adjacent opposite surfaces of said assembly in contact with said terminals, and including air pressure variation means disposed to force the contact sheet into good electrical contact with the respective assembly terminals.

13. Testing means as defined in claim 5 wherein said contact means comprises one medium for registering with one surface of said assembly, interconnected conductors on both sides of said medium, voltage supply circuits connected to said interconnected conductors to selectively pass current therethrough to circuits on said assembly, and continuity indicating means for physically scanning along a dimension of said assembly on the outer surface of said medium to contact one of said access terminals.

14. Testing means as defined in claim 13 wherein the conductors on said assembly are generally parallel and longitudinally disposed along said dimension, and said continuity indicating means comprises a plurality of side by side contactors for simultaneously scanning in parallel the test circuit contactors for different conductors on said assembly.

15. Testing means as defined in claim 13 including a conductive short testing circuit on said medium registering within said insulator regions on said assembly, and means testing for short circuits by sensing current flow between conductive patterns of said short testing circuit and the conductors on said assembly surface.

16. Testing means as defined in claim 5 wherein the last mentioned means comprises a manually scannable member with a plurality of conductive contacts thereon connected to the test circuit contactors by manual manipulation thereof with each conductive contact arranged to connect with one of said access terminals by medium of said test circuit contactors disposed on said flexible contact sheet.

17. Testing means as defined in claim 16 wherein the flexible contact sheet has an insulating coating covering the surface opposite the contact surface with said assembly except for the said test circuit contactors disposed for contact with said scanning member.

* * * * *